United States Patent [19]

Crippen

[11] Patent Number: 4,885,036

[45] Date of Patent: Dec. 5, 1989

[54] ON-LINE FILTRATION OF POTASSIUM PERMANGANATE

[75] Inventor: Warren S. Crippen, Simpsonville, S.C.

[73] Assignee: Digital Equipment Corporation, Maynard, Mass.

[21] Appl. No.: 185,245

[22] Filed: Apr. 19, 1988

Related U.S. Application Data

[63] Continuation of Ser. No. 880,711, Jul. 1, 1986, abandoned.

[51] Int. Cl.$^4$ .............................................. B08B 7/04
[52] U.S. Cl. .................................. 134/13; 134/22.17; 134/25.4; 156/902; 210/805
[58] Field of Search ............... 134/10, 13, 22.1, 22.13, 134/22.16, 22.17, 22.18, 25.4; 156/655, 668, 902; 252/79.1; 210/196, 712, 722, 738, 767, 805; 427/97, 98, 307

[56] References Cited

U.S. PATENT DOCUMENTS

| | | | |
|---|---|---|---|
| 3,276,106 | 10/1966 | Bester et al. | 156/655 |
| 3,506,397 | 4/1970 | Vincent et al. | 423/321 R |
| 3,905,827 | 9/1975 | Goffredo et al. | 210/912 |
| 3,928,148 | 12/1975 | Lerner | 204/38.4 |
| 4,279,948 | 6/1981 | Kukanskis et al. | 427/305 |
| 4,425,380 | 1/1984 | Nuzzi et al. | 427/97 |
| 4,431,500 | 2/1984 | Messing et al. | 204/206 |

OTHER PUBLICATIONS

*Perry's Chemical Engineer's Handbook*, 4th edition, 1963, pp. 6-11 to 6-12.
Nuzzi, "An Improved Permanganate Smear Removal Process", PLFAB, Mar. 1984.
Enthone Incorporated Data Sheet for Enplate® MLB-497, Feb. 1984.

*Primary Examiner*—Peter Hruskoci
*Attorney, Agent, or Firm*—Nutter, McClennen & Fish

[57] ABSTRACT

A system and method are provided for the on-line filtration of potassium permanganate desmearing solution. The solution, with manganese dioxide precipitate, is continuously pumped from a desmearing tank so the precipitate can be removed. The system has piping resistant to any chemical corrosion that either the solution or the precipitate may cause. An air-driven diaphragm pump is used to pump the solution-precipitate mixture through the system. A multi-tube filter unit removes the precipitate from the mixture. The filtered, precipitate-free, solution is then returned to the desmearing tank.

23 Claims, 1 Drawing Sheet

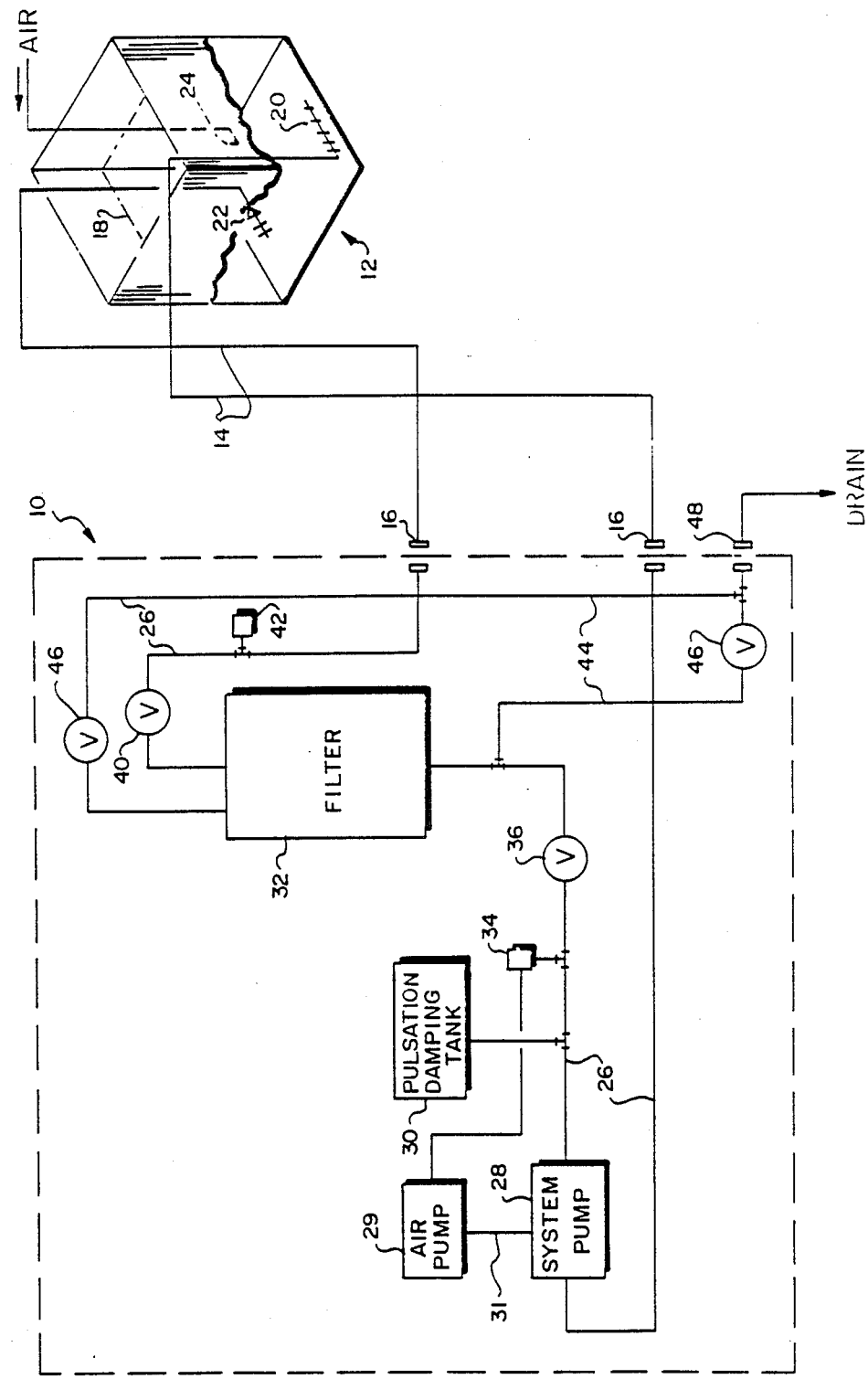

ON-LINE FILTRATION OF POTASSIUM PERMANGANATE

This application is a continuation of application Ser. No. 880,711, filed July 1, 1986 now abandoned.

FIELD OF THE INVENTION

This invention relates to the on-line filtering of desmearing solution used in the fabrication of printed wire boards, and in particular, to the on-line filtering of potassium permanganate used in a desmearing solution.

BACKGROUND OF THE INVENTION

One important step in the fabrication of multilayered printed wiring boards is the removal of drill smear. Drill smear is found in holes drilled through multi-layer printed wiring boards. Drill smear is formed by dielectric material that is melted, or smeared, into an electrical connection hole by the heat generated by a drill bit as the hole is being bored. The smear covers the abutting edges of conductors on the individual boards. This makes it difficult to metalize the hole to connect together the conductors that abut the hole. Thus, it is necessary to remove the smear, a process called "desmearing", prior to the later metalizing process.

In the past, concentrated sulfuric acid has been used as a desmearing agent. However, it has not always proved to be efficient. Its viscosity and strong accidity make it difficult to work with. With large holes, (0.043 in. in radius or greater) if the acid is not removed quickly, it will etch holes of uneven size. This makes it difficult to properly metalize the holes. With small holes (less than 0.043 in. in radius), the viscous nature of the sulfuric acid prevents it from flowing into the holes. This reduces the thoroughness of the desmearing process, with resultant problems in the subsequent electroplating process.

Recently, it has been found that potassium permanganate works well in a desmearing solution. It removes all traces of smear on printed wire boards, yet, it is not as corrosive as sulfuric acid. As a result, it is becoming a preferred desmearing agent.

However, the chemical ractions involving the use of potassium permanganate are highly oxidizing, and produce a precipitate of manganese dioxide. The precipitate can agglomerate and thereby plug up small holes, defeating the purpose of the desmearing. Also, large amounts of precipitate settle in the bottom of the tank and form a semi-solid sludge. This makes it impossible to place printed wiring board near the bottom of the tank for they quickly become covered with a layer of precipitate. These problems have become more serious with the trend to greater component density on the boars and attendant reduction in hole sizes. Reducing the bath life of each batch of potassium permanganate has not appreciably reduced this problem.

There is also a problem of disposal of the desmearing bath when potassium permanganate has been used. It is difficult and expensive to clean out the sludge from the desmearing tank. Also, the sludge contains free liquid that is a hazardous waste, and thus must be disposed of in a relatively costly manner.

One suggested way to reduce the precipitate problems was to batch filter each desmearing bath containing potassium permanganate. Each bath was first allowed to cool to room temperature (the desmearing solution must be heated prior to sue heat). A slurry of solution and precipitate was then pumped through a filter. However, the precipitate immediately formed a paste-lke coating on the filter, making it impossible to filter additional solution.

A need therefore exists for a method to remove manganese dioxide precipitate from a potassium permanganate desmearing solution. This method should reduce the amount of precipitate in the solution to a low level to minimize precipitate clogging of holes in the printed wire board. Reducing the amount of precipitate will also extend the bath life of each batch of potassium permanganate and make it easier to clean the desmearing tank between baths.

SUMMARY OF THE INVENTION

This invention comprises an on-line recirculating filtration system for removing the manganese dioxide precipitate from the desmearing solution. The system includes an intake sparger located in the desmearing tank to remove the unfiltered solution. A pump forces the solution from the intake sparger through a multitube filter, which removes the precipitate from the solution. The filtered solution is returned to the desmearing tank through a return sparger that is located dismetrically across from the intake sparger. Chemical and temperature resistant piping connects the components of this system together. The system continuously removes the precipitate from the solution during the desmearing procedure to substantially eliminate precipitate-clogging of holes in printed wire boards.

There are additional advantages to this on-line filtraton system beyond eliminating the incidence of clogged holes. The flow of filtered solution out of the return sparger sweeps settled precipitate across the bottom of the tank towards the intake sparger. This keeps the bottom of the tank substantially free of precipitate so that printed wiring boards may be placed there. Since the amount of precipitate in the solutions is substantially decreased, the bath life of each batch of desmearing solution is significantly increased. The filter system also serves to condense and trap most of the precipitate in the filter. The resulting caustic deposit on the filter can then be readily neutralized. The final waste product can then be disposed of as a nonhazardous waste. This materially reduces the cost of using potassium permanganate as a desmearing agent.

BRIEF DESCRIPTION OF THE DRAWING

FIG. 1 is a block diagram showing the various components of the on-line filtering system of this invention.

DETAILED DESCRIPTION OF THE PREFERRED EMBODIMENTS

As illustrated in FIG. 1, the on-line filter system 10 is connected to a desmearing tank 12. The filter system 10 may be housed in a single module (not illustrated) and connected to desmearing tank piping 14 by mating flanges 16. The desmearing tank 12 contains desmearing solution 18 with manganese dioxide precipitate mixed in. A system pump 28 is used to extract the solution-precipitate mixture from the desmearing tank 12 by way of an intake sparger 20 located along at least one edge of the tank bottom. The mixture is forced through a filter 32. A return sparger 22 returns the filtered solution to the bottom of the tank 12. The return sparger 22 is located diametrically across the bottom of the tank from the intake sparger 20. For example, if the intake sparger 20 is located across the left half of the front of the tank, the return sparger 22 should be located across the right half of the back of the tank. The components of the filter system are connected together by piping 26. The desmearing tank 12 is also provided with an air sparger 24. The air sparger 24 delivers compressed air to the tank from a pump (not shown) to stir the desmearing solution. This motion maintains the efficiency of the desmearing process.

The system pump 29 is preferably an air driven diaphragm pump. A diaphragm pump is used because the granular nature of the precipitate would erode the components of an impeller pump. The pump diaphragm is composed of polytetrafluoroethylene or other chemically resistive material. The system pump is supplied with air from an air pump 29 and contected to the air pump 20 along an air line 31. Since the system pump 29 is air driven, it will automatically "shut-off" if fluid head pressure becomes too great. This serves as a relief cut-off in case of system failure. A pulsation damper tank 30 is located after the system pump 28 to muffle the flow flutter caused by the pump.

The filter 32 is provided with a number of tube-type filter elements, (not illustrated here). In this embodiment of the invention, the filter elements are polypropylene filter cartridges. Each cartridge is constructed with pleated polypropylene filter paper located in a tube of polypropylene mesh. Satisfactory filtration has been obtained with a Chem Mag GFC-1500PP filter manufactured by Caster Pump of Vicenza, Italy provided with filter cartridges manuactured by the Sethco Division of Metpro Corporation of Hauppauge, New York.

Between the pulsation damper tank 30 and filter 32 is a pressure switch 34 elecrically connected to deactivate the air pump 29. If the head pressure to the filter is excessive, the pressure switch is tripped, stopping the flow of air to the system pump 28. This causes the system pump 28 to shut down and cuts off the flow to the filter 32. A filter input valve 36 and a filter output valve 40 are provided adjacent the input and output ends of the filter so the filter can be isolated for maintenance purposes. A flow meter 42 located after the filter output valve 40 monitors the rate of fluid flow.

A drain system 44 is coupled to both the input and output ends of the filter 32. Flow through the drain system 44 is controlled by on-line drain valves 46 and the filter output valve 40. The drain system 44 is coupled to an external drain system (not illustratd) by a drain mating flange 48.

The filter system piping 26, and the desmearing tank piping 14, are formed from chemically and temperature resistive material. For example, polyvinylidene floride plastic piping is used. This eliminates the possibility of solutions or precipitate corroding the pipe. For this reason also, all the pipe fittings and other pieces exposed to the solution-precipitate mixture are lined with non-corrosive material such as polytetrafluoroethylene.

The filter system 10 should be operated continuously whenever there is potassium permanganate in the desmearing tank 12. This is because potassium permanganate is a strong oxidizing agent and precipitate will form when ambient dust settles in the tank, even when the tank is empty of printed wiring boards. Operating the filter system 10 continuously insures that the desmearing tank 12 is always kept precipitate free.

When printed wiring boards with drill smear are placed in the desmearing tank 12, manganese dioxide, a ceramic material, precipitates out of the solution. The precipitate is swept across the bottom of the desmearing tank 12 towards the intake sparger 20 by the flow of filtered solution out of the return sparger 22. The solution-precipitat mixture is pumped from the desmearing tank 12 to the filter system 10. The pulsation damper tank 30 muffles the flow so that a steady stream of solution-precipitate mixture is pumped to the filter 32. The filter 32 removes the precipitate and then the filtered solution is returned to the tank. The air supplied through the air sparger 24 stirs the solution so the filtered solution is dispersed throughout the desmearing tank 12 and so that there is no large build up of precipitate-laden solution at any location in the desmearing tank 12.

The filter elements are regularly changed so the manganese dioxide can be removed. The filter elements are dewatered to remove any entrapped free liquid. The dewatered filter elements with solid manganese deposit can then be neutralized and disposed of in an appropriate manner.

Accordingly, the concentration of precipitate is never allowed to build up to the point where it adversely affects the boards being desmeared. This appreciably extends the useful life of the desmearing solution in the desmearing tank 12. Also, since the sweeping action of the filtered solution keeps the bottom of the tank precipitate free, printed wiring boards may be placed near the bottom of the desmearing tank 12 without become covered with precipitate. The tank may be drained by selective operation of the drain system 44 and the filter output and drain valves 40, 46.

What is claimed as new and desired to be secured by Letters Patent of the United States is:

1. A method of removing manganese dioxide precipitate that forms in a desmearing tank during a desmearing process that employs a desmearing solution including potassium permanganate so as to cause a solution-precipitate mixture, including the manganese dioxide precipitate, to form in the desmearing tank during the desmearing process, comprising the steps of:
   (a) continually pumping the solution-precipitate mixture from the desmearing tank at least concurrently with the desmearing process;
   (b) filtering the solution-precipitate mixture pumped from the desmearing tank to remove the precipitate including the manganese dioxide precipitate therefrom; and
   (c) returning the filtered solution to the desmearing tank concurrently with said solution-precipitate pumping.

2. The method of claim 1 wherein the solution-precipitate mixture is pumped by a diaphragm pump.

3. The method of claim 2 wherein the pump is gas operated.

4. The method of claim 2 wherein the portions of the pump in contact with the solution and precipitate are resistant to chemical and temperature corrosion from the potassium permanganate and the manganese dioxide.

5. The method of claim 1 wherein the precipitate is dispersed in the solution.

6. The method of claim 5 wherein the precipitate is dispersed in the solution-precipitate mixture by supplying gas to the desmearing tank.

7. The method of claim 1 wherein the solution-precipitate mixture is pumped form the desmearing tank and the filtered solution is returned to the desmearing tank through a piping resistant to chemical and temperature corrosion from the potassium permanganate and manganese dioxide.

8. The method of claim 1 wherein the solution-precipitate mixture is filtered through a filter with a plurality of tubetype filter elements.

9. The method of claim 8 wherein the tube-type filter elements are provided with polypropylene paper disposed inside a tube of polypropylene mesh.

10. The method of claim 1 wherein the manganese dioxide is removed from a desmearing solution elevated above room temperature.

11. A method of removing manganese dioxide precipitate that forms in a desmearing tank during a desmearing process that employs a desmearing solution including potassium permanganate to remove drill smear from printed wiring boards placed in the desmearing tank so as to cause a solution-precipitate mixture, including the manganese precipitate, to form in the desmearing tank during the desmearing process, comprising the steps of:
(a) continually pumping the solution-precipitate mixture from the desmearing tank at least concurrently with the desmearing process;
(b) filtering the solution-precipitate mixture pumped from the desmearing tank to remove the manganese dioxide precipitate therefrom; and
(c) returning the filtered solution to the desmearing tank concurrently with said solution-precipitate pumping.

12. The method of claim 11 wherein said solution-precipitat mixture pumping, said solution-precipitate filtering, including the removal of the manganese dioxide precipitate, and said returning of said filtered solution is further performed prior to the placement of the printed wiring boards in the desmearing tank.

13. The method of claim 12 wherein said solution-precipitate mixture pumping, said solution-precipitate filtering, including the removal of the manganese dioxide precipitate, and said returning of said filtered solution is further performed after the printed wiring boards are removed from the desmearing tank.

14. The method of claim 11 wherein said solution-precipitate mixture pumping, said solution-precipitate filtering, including the removal of the manganese dioxide precipitate, and said returning of said filtered solution is further performed after the printed wiring boards are removed from the desmearing tank.

15. The method of claim 11 wherein the solution-precipitate mixture is pumped by a diaphragm pump.

16. The method of claim 15 wherein said pump is gas operated.

17. The method of claim 15 wherein the portions of the pump in contact with the solution and the precipitate are resistant to chemical and temperature corrosion from the potassium permanganate and the manganese dioxide.

18. The method of claim 11 wherein said precipitate is dispersed in the solution.

19. The method of claim 18 wherein the precipitate is dispersed in the solution-precipitate mixture by supplying gas to the desmearing tank.

20. The method of claim 11 wherein the solution-precipitate mixture is pumped from the desmearing tank and the filtered solution is returned to the desmearing tank through piping resistant to chemical and temperature corrosion from the potassium permanganate and manganese dioxide.

21. The method of claim 11 wherein the solution-precipitate mixture is filtered through a filter with a plurality of tube type filter elements.

22. The method of claim 21 wherein the tube-type filter elements are provided with polypropylene paper disposed inside a tube of polypropylene mesh.

23. The method of claim 11 wherein the manganese dioxide precipitate is removed from a desmearing solution at a temperature elevated above the room temperature.

* * * * *